United States Patent [19]

Inayoshi et al.

[11] 4,125,426
[45] Nov. 14, 1978

[54] METHOD OF MANUFACTURING SEMICONDUCTOR DEVICE

[75] Inventors: Katsuyuki Inayoshi, Yokohama; Yoshinobu Monma, Kawasaki, both of Japan

[73] Assignee: Fujitsu Limited, Kawasaki, Japan

[21] Appl. No.: 825,763

[22] Filed: Aug. 18, 1977

Related U.S. Application Data

[63] Continuation of Ser. No. 681,406, Apr. 29, 1976, abandoned.

[30] Foreign Application Priority Data

Apr. 29, 1975 [JP] Japan .................... 50-51521

[51] Int. Cl.² ........................ H01L 21/312
[52] U.S. Cl. .................... 156/656; 29/578; 148/1.5; 148/188; 148/191; 156/657
[58] Field of Search ........... 156/643, 656, 657, 659; 148/175, 187, 188, 191, 1.5; 29/580, 578, 390

[56] References Cited

U.S. PATENT DOCUMENTS

| | | | |
|---|---|---|---|
| 3,719,535 | 3/1973 | Zoroglu | 148/187 |
| 3,759,762 | 9/1973 | Barone et al. | 148/187 |
| 3,764,409 | 10/1973 | Nomura et al. | 148/175 |
| 3,867,216 | 2/1975 | Jacob | 156/643 |
| 3,928,081 | 12/1975 | Marley et al. | 148/187 |

*Primary Examiner*—Jerome W. Massie
*Attorney, Agent, or Firm*—Staas & Halsey

[57] ABSTRACT

A simplified method of manufacturing a semiconductor device is disclosed wherein a base region is formed on a silicon substrate and an impurity is diffused into the base region. Any insulating film present on the silcon substrate is removed, substrate and an even film of silicon dioxide is coated thereon. Emitter diffusion windows, base electrode windows, collector electrode windows and resistor electrode windows are formed in the silicon dioxide film and a uniform film of polycrystal silicon is deposited over the silicon dioxide film and the electrode windows. Impurities are diffused through the polycrystal silicon film at the emitter and collector windows but not through the base window. An aluminum electrode layer is formed on the polycrystal silicon layer and patterned to form an electrode wiring pattern. Subsequently, the polysilicon layer is removed in exposed areas utilizing the aluminum electrode layer as a mask.

10 Claims, 8 Drawing Figures

METHOD OF MANUFACTURING SEMICONDUCTOR DEVICE

This is a continuation, of application Ser. No. 681,406 filed Apr. 29, 1976, now abandoned.

BACKGROUND OF THE INVENTION

1. Field of the Invention

This invention relates to a simplified method of manufacturing a bipolar transistor.

2. Description of the Prior Art

In order to obtain an integrated circuit capable of high speed operations, it is necessary to reduce the size of the bipolar transistor therein. However, the method of achieving the desired size reduction must result in a product having a degree of realiability.

The photolithography process of manufacturing is generally employed, at present, and its accuracy is on the order of $1\mu$.

In the photolithograph process, the IC's are manufactured by the so-called planar method. This manufacturing method comprises a series of manufacturing process steps such as isolation diffusion, collector contact diffusion and resistor diffusion, etc. This series of process steps requires highly accurate mutual positional relationships between the diffusion areas.

Generally, a composed mask method is used in manufacturing high density IC's, in order to meet the above positional requirements. In the composed mask method, the same mask (called the composed mask) provides the pattern for forming the abovementioned isolation diffusion window, collector contact window, base diffusion window and resistance diffusion window. The windows are simultaneously provided at one time on a specific insulation film, for example, on the silicon nitride which covers the semiconductor substrate surface. In other words, this composed mask method utilizes a self-aligning principle. The idea of the composed mask method is also applicable for providing each electrode of the emitter, base, collector and resistor, and is also applicable to the manufacture of high density IC's. The composed mask method is explained in detail in the following description and is very important with respect to the present invention.

To illustrate the prior art method of constructing IC's, reference is made to FIGS. 1–4.

FIG. 1 shows a partial cross-section of a P- type substrate 10, upon which process steps have been performed, up to and including the step of base diffusion by the composed mask method. Namely, after performing an impurity diffusion step forming the buried N+ layer 11 on the P- type silicon substrate 10, the epitaxial N type layer 12 is grown thereon. A thin oxide film 13 covers the layer 12. A silicon nitride film 14 is coated on the thin oxide film 13 by chemical vapor deposition process and a silicon dioxide film 15 is subsequently coated thereon. A photo resist is coated on the surface of film 15, exposed and developed by using above-mentioned composed mask. The film 15, in areas which are to be subject to isolation diffusion, collector contact diffusion, base diffusion and resistor diffusion, is selectively removed by hydrofluoric etching.

The substrate 10 is then dipped into boiling phosphoric acid wherein the film 15 is used as a mask and only the exposed silicon nitride film 14 is etched. Thus, an isolation diffusion window 16, a collector contact diffusion window 17 and a base diffusion window 18 are formed in the silicon nitride film 14.

The oxide film 13, in the window 16, is then removed by a conventional photolithography method and a P+ type impurity is diffused through window 16 into the epitaxial layer 12 to form the isolation region 19.

The oxide film 13, in the window 17, is separately removed by a second photolithography method, and an N+ type impurity is diffused into the epitaxial layer 12 through window 17 to thereby form an N+ collector contact region 20.

Finally, the oxide film 13, in the window 18, is removed and P type impurity is diffused into the epitaxial layer through this window, thus forming the P base region 21.

By previously forming the windows 16, 17 and 18 in the nitride film 14, the positional relation between them is inevitably limited. Therefore, it is unnecessary to obtain positional alignment as each window is sequentially formed, since the window which is the same as that provided on the nitride film 14 corresponds to the window formed in the film 13, and, by this reason, alignment is simplified.

The idea of the composed mask mentioned above can also be applied to the formation of each electrode. As shown in FIGS. 2 and 3, chemical vapor deposition is applied to the surface and thereby a second layer of silicon nitride 22 and a second layer of silicon dioxide 23 are formed. Then, an emitter diffusion window 24, a base electrode window 25 and a collector contact window 26 are formed in the second silicon nitride 22 by using a composed mask different from that employed in conjunction with the FIG. 1 description. The oxide film 13 again present in exposed windows 24 and 26 is removed by the photolithography method and a polycrystalline silicon layer 27 is coated over the entire surface, as is shown in FIG. 3. A phosphosilicate glass layer 28 is coated thereover. The phosphorous, in the layer 28, is diffused into the epitaxial layer 12 by passing through the silicon layer 27 at the windows 24 and 26 to thereby form an N+ emitter region 29 and an N+ collector contact region 30.

After the emitter diffusion, surface layer 28 is entirely removed. Then, the silicon layer 27 and oxide film 13, in the base electrode window 25, are also removed by the photolithography method.

In FIG. 4, an aluminum layer 31 is shown which was coated on the entire surface and then selectively removed to form an electrode wiring pattern after sintering. Thus, an emitter electrode 32, a base electrode 33 and a collector electrode 34 are formed.

The bipolar transistor, manufactured by the abovementioned prior art manufacturing method illustrated in FIGS. 1–4, has a polysilicon layer 27 between the emitter electrode 32 and emitter region 29. Therefore, during sintering to obtain an ohmic contact between the emitter electrode 32 and the emitter region 29, the eutectic alloy of aluminum and silicon forming the electrode will not reach the PN junction between emitter and base. Thereby, a high speed and high density IC is manufactured with a very shallow emitter region.

However, in the course of executing the above-mentioned prior art manufacturing method, a basic defective feature has been found. When etching the oxide film 13, in the base electrode window, by using the nitride film 22 as the mask, the oxide film 13 tends to become over-etched in the area where the oxide film is relatively thin. Therefore, an overhang of the nitride film 22 is formed as shown in FIG. 4. An aluminum electrode subsequently provided at that etched portion, thereby may become open due to the nitride overhang. Such overhand is formed at the emitter electrode window 24 and the collector electrode window 26. However the polysilicon layer 27 covers the overhang due to the special method of chemical vapor deposition.

On the other hand, when providing an electrode window it is necessary to coat a silicon nitride film 22 and a silicon oxide film 23, which thereby makes the IC manufacturing process complex.

SUMMARY OF THE INVENTION

An object of the present invention lies in an improved method of manufacturing a bipolar transistor which does not cause wire openings.

Another object of the present invention is to provide a simplified method of manufacturing a semiconductor device which can utilize the composed mask method in a process for providing an electrode window without necessitating the use of additional kinds of insulation film, such as silicon nitride.

According to the present invention, an emitter electrode window and a base electrode window are provided on an insulation film covering the semi-conductor substrate surface after the base region is formed. Up to the process for forming the base region, the prior art method is applied and the base region is formed on the desired part of the semiconductor substrate surface.

The method which is generally used for forming the base region is the gaseous diffusion method. Recently, the ion-implantation method has also been used.

The ordinary gaseous diffusion method includes an impurity deposition process and a drive-in process for spreading the impurity up to the desired depth. In this case, the base region surface is covered with a new oxide film. On executing the present invention, all processes can be completed with the least number of steps by starting from the semiconductor substrate surface which is covered with the insulation film and which has the base region already formed.

Particularly, in the case of high density integrated circuits, the self-align method using silicon nitride film, as explained in relation with FIGS. 1-4, is employed up to the process of base diffusion. Therefore, when executing the present invention, the earlier used insulation film on the surface, is completely removed, and a new insulation film is coated on the substrate surface at a uniform thickness, which is a more preferable kind of insulation film. This method is explained in detail in the description of the preferred embodiment, given later.

In the case of forming the base region with the ion-implantation method, metallic, photoresist or insulator mask is usually formed on the semiconductor substrate exposing the base region surface and then the ion-implantation is carried out. An annealing process is performed after the ion-implantation, and a new insulating film is thereby grown on the base region surface. In this case, the mask which has been used previously and the semiconductor substrate of which surface is covered with the insulating film on the base region surface can be used as the starting material of the present invention. Or, as mentioned above, after the gas diffusion method when all the insulation film on the surface is completely removed, the semiconductor substrate coated with a new insulating film of a uniform thickness can be used as the starting material for the present invention.

In any case, such a semiconductor substrate having a formed base region and its surface covered with an insulating film is used as the starting material of the present invention. Also, the emitter electrode window and base electrode window are formed and contain insulating film on the surface of the semiconductor substrate. During manufacture of the semiconductor integrated circuits of the present invention, a collector electrode window and a resistor electrode window are further formed.

Thus, if necessary, all electrode windows are formed on the insulating film of the surface. Therefore, not only the process to sequentially form each electrode window becomes unnecessary but also mutual position of each electrode window can be accurately determined. Therefore, it is not necessary to prepare the margin of alignment and it is also possible to manufacture integrated circuits having a minute transistor size in a high density structure.

In the present invention, an impurity is diffused through the emitter electrode window, by forming a polycrystal semiconductor layer on the semiconductor substrate surface. The polycrystal semiconductor layer covers both the insulating film surface and each electrode window surface. The polycrystal semiconductor layer is formed by vacuum evaporation of semiconductor materials, gaseous vapor deposition of sputtering.

Practically speaking, a chemical vapor deposition of the polycrystal semiconductor layer results in a more uniform film thickness being formed on many types of semiconductor substrates. Moreover, chemical vapor deposition ensures satisfactory resistive contact of the polycrystal silicon for the base region. This effect is made clear in the description which follows.

Of course, the polycrystal semiconductor layer is not required to contain a mixture of a particular impurity, and even though polycrystal semiconductor usually contains some amount of impurities, the concentration of impurity is usually at such a low level that it cannot be used for ordinary diffusion.

As described above, the above-mentioned polycrystal semiconductor layer exists between the base region and the base electrode metal that will be coated in the next stage, but sufficient ohmic contact can still be achieved. For this purpose, the polycrystal semiconductor layer is formed having a thickness in a particular range corresponding to the thickness of electrode metal to be coated. The most preferable thickness of the polycrystal semiconductor layer is 500A to 2000A, but it may also be in the range of 100A to 3000A.

Formation of the emitter can be made by several methods. The most simple method is growth of the diffusion source by gaseous phase following the growth by gaseous phase of the polycrystal semiconductor. A glass film containing the impurity for emitter formation is continuously grown on the polycrystal semiconductor layer.

A typical glass film, which includes N type impurity, is the phosphosilicate glass and arsenicsilicate glass; while a typical glass film, which includes P type impurity, is the borosilicate glass.

Then, this glass film is removed from at least the base electrode window. In the case of integrated circuits, the glass film is also removed from the resistor electrode window, mentioned above. If the Schottky junction is included, the glass film is removed from the Schottky junction forming region.

The impurity in the glass film is then diffused into the semiconductor substrate through the emitter electrode window by heat treating the emitter diffusion, thus forming the emitter region. This heat treatment is performed usually within the temperature range of 1000° to 1250° C. and the heating period is set for obtaining an emitter region having a predetermined depth. If a shallow junction transistor is desired, the heating period is only several minutes and the polycrystal semiconductor being exposed to the base electrode window is only slightly oxidized.

During the emitter diffusion, the base impurity is diffused into the polycrystal semiconductor layer which is not covered with the glass film. For example, the polycrystal semiconductor layer in the base electrode window is diffused from the base region of the substrate within the contact region and thereby this polycrystal semiconductor layer becomes conductive.

Another typical method for emitter formation is that of ion implantation. In this case, an area, such as base electrode window, is covered with the mask such as photoresist, silicon dioxide, silicon nitride, aluminum or alumina, and the polycrystal semiconductor layer in the emitter electrode window is exposed.

In order to implant the phosphor and arsenic with a doping amount of $1 \times 10^{15}$ atom/cm$^2$, the implantation energy of 100 KeV and 200 KeV is respectively required.

During the heat treatment after ion implantation, namely in the annealing process, the base impurity in the base region is diffused into the polycrystal semiconductor layer in the base electrode window as mentioned above, making the polycrystal semiconductor layer conductive.

For either the above-mentioned diffusion method or ion implantation method, the next process is to remove the mask on the polycrystal semiconductor layer.

According to the present invention, the semiconductor substrate is entirely covered with the polycrystal semiconductor layer. Therefore, it is possible to remove all masks without causing the polycrystal semiconductor layer to deteriorate when removing the masks by chemical etching. Moreover, in this etching process, since no material under the polycrystal semiconductor layer is etched, the etching process can be done very easily. In addition, since the substrate is entirely covered with the polycrystal semiconductor layer the insulating film on the semiconductor substrate surface is never subject to contamination.

The electrode metal material is coated on the polycrystal semiconductor layer by evaporation and sputtering. The most desirable material is aluminum, but other conducting materials can also be used. These electrodes metal materials are coated with the sufficient thickness so as to serve as wiring conductors. Wiring conductors of aluminum are usually in the range of 8000 to 15000A thick.

The electrode metal material is first etched to form the wiring and the electrode. Then the exposed polycrystal semiconductor layer is removed, and thus, all the electrodes are simultaneously formed.

According to the above-mentioned steps of the present invention, as contrasted with the prior art, an existing multilayer mask material of silicon dioxide and silicon nitride is not used in the electrode window formation process and under-cutting of the silicon oxide film does not occur in the window forming process. Therefore, there is no chance of wire opening at the under-cut area. Moreover, the process of sequentially providing the electrode windows becomes unnecessary, and drastically simplifies the manufacturing process of the semiconductor device.

Moreover, since it is possible to provide the emitter electrode window, the base electrode window and the collector electrode window at a single time in the insulating film, for example, the silicon oxide film, the aligning margin of each window becomes unnecessary and thereby integrated circuits having minute transistor size and high density structure can be manufactured.

In addition, since the impurity for emitter formation is introduced through the emitter electrode window, which is previously provided, the emitter and emitter electrode window are therefore perfectly aligned.

Furthermore, in case of the present invention, a polycrystal semiconductor layer is coated over the entire surface after each electrode window is formed. Therefore, the following steps, up to the formation of the wiring, will not cause contamination and there is no over etching of the insulating film even when the diffusion source and mask subsequently coated on the polycrystal semiconductor layer are removed.

The polycrystal semiconductor layer remains between each electrode and the semiconductor substrate and therefore prevents destruction of the shallow PN junction under the electrode even when the electrode material which is likely to penetrate into the electrode material is used as the semiconductor substrate.

Also, according to the present invention, the polycrystal semiconductor layer provided within the base electrode window has conductivity after completion of emitter diffusion and therefore contact resistance of the base electrode is low. Thus, particular processing is not required for making the polycrystal semiconductor layer, under the base electrode, conductive and simplified manufacturing method is realized.

Other features and advantages of the present invention will be further clarified by the following explanation with respect to the preferred embodiment.

DETAILED DESCRIPTION OF THE PREFERRED EMBODIMENT

Figure 1:
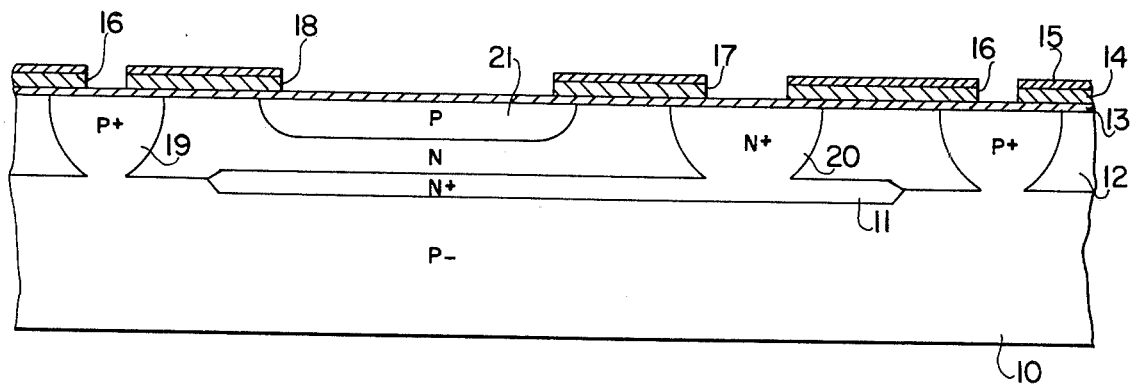
FIGS. 1 to 4 show the cross-sections during manufacturing steps of prior art high density integrated circuits manufactured by applying the so-called composed mask method.
Figure 5:
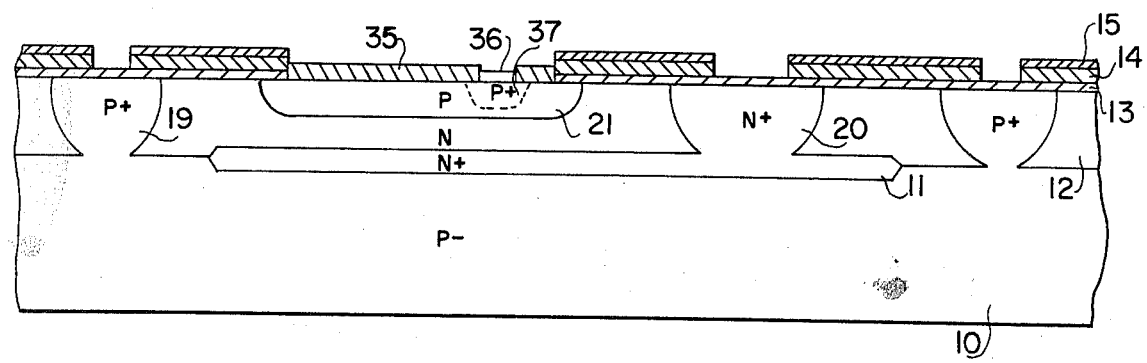
FIGS. 5 to 8 show the cross-sections during manufacturing steps of the present invention used to construct an integrated circuit.

The following description of the embodiment of the present invention is understood as a method which follows the steps of the process described in relation to FIG. 1. As shown in FIG. 5, the P- type substrate, with a buried N+ layer 11 has an epitaxial layer 12 grown thereon. A layer of thin oxide film 13 and a layer of nitride film 14 are deposited on the epitaxial layer 12. In this embodiment, the thickness of the epitaxial layer 12 is 2 to 3μ, the thickness of the oxide film 13 is, for example, 750A and the thickness of the nitride film 14 is, for example, 2500A. Then, the oxide film 13 in the each windows is selectively reoxidized to the thickness of about 300A.

Base diffusion is achieved by a process, wherein the impurity source is boron tribromide, the deposition temperature is approximately 930° C. and the base surface sheet resistivity is approximately 75 ohms/square.

A drive-in process is carried out for 60 minutes at 1000° C. This drive-in process is performed under an oxygen ambient condition and silicon dioxide film 35 is formed on the base surface with a thickness of about 2000A.

A resistor diffusion process follows, and is executed in unshown islands. At the same time, resistor diffusion is also made partly within the base, in order to reduce the base contact resistance. Namely, as shown in FIG. 5, the window is provided in the oxide film in the base and resistor diffusion is performed. Sheet resistivity after the resistor diffusion is 27 ohms/square, and it becomes 44 ohms/square after the drive-in process in an oxygen ambient condition. The oxide film 36 newly developed on the silicon surface of the diffusion area 37 has the thickness of approximately 1250A.

On the other hand, depth of base 21 is approximately $0.45\mu$ and the base sheet resistivity at the area other than the base contact diffusion region is approximately 300 ohms/square.

Figure 6:
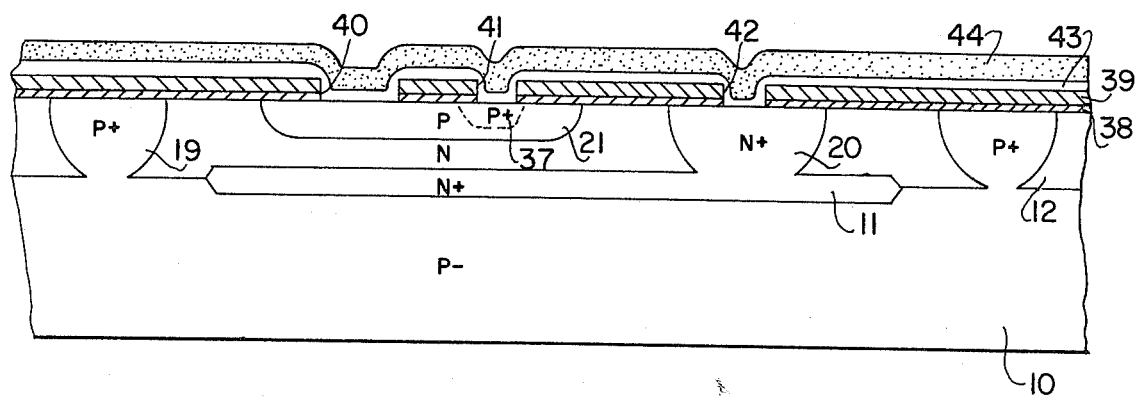

In this embodiment the insulating films on the epitaxial layer (i.e., oxide film 13 and nitride film 14) are removed in succession, and reoxidation is performed by heating the substrate at 900° C. in steam. The silicon dioxide obtained thereby is shown by the number 38 in FIG. 6 and its thickness is about 1000A. In order to obtain an insulating film having sufficient thickness to act as a surface protection film, a silicon dioxide layer 39 having the thickness of 4000A is coated by the chemical vapor deposition method. The reaction gas used for this chemical vapor deposition is the monosilane and nitrogen monoxide, and the heating condition is 850° C. for 40 minutes.

Figure 2:
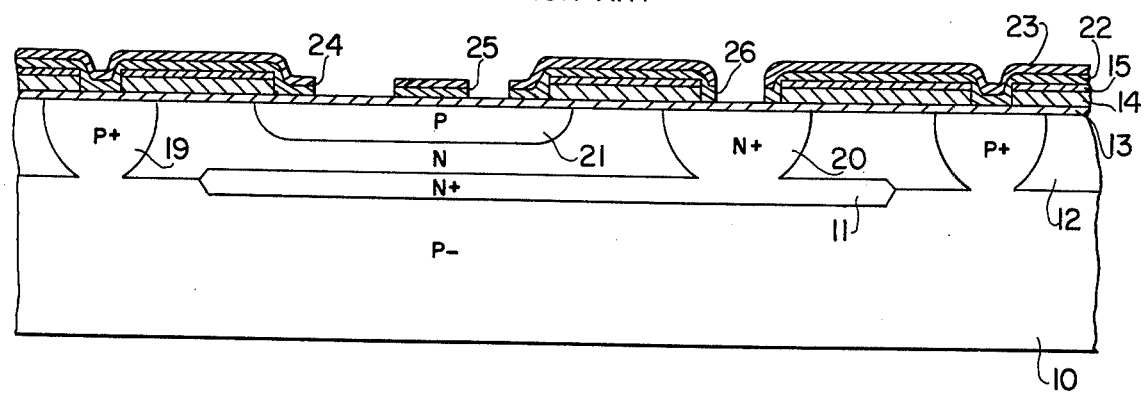
Figure 3:
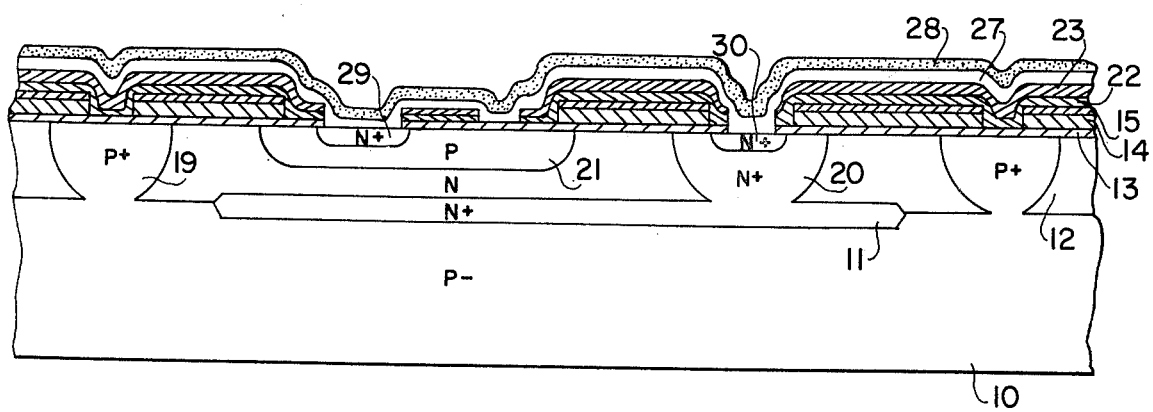
Figure 4:
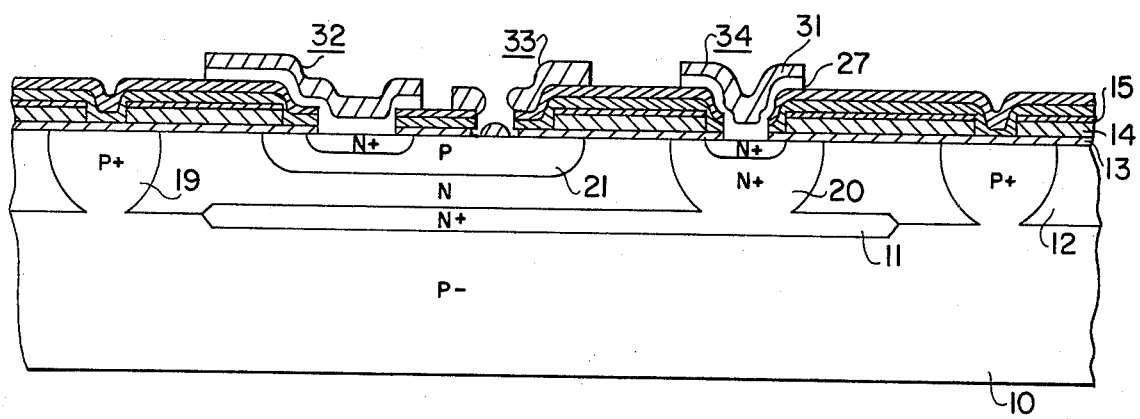

By using the composed mask employed in the process described above with respect to FIG. 2, the emitter electrode window 40, the base electrode window 41, and the collector electrode window 42 (also resistor electrode window, but illustrated) are formed in the silicon dioxide layers 38 and 39. Then, a polysilicon layer 43 is coated over the entire surface. The polysilicon layer 43 is preferably obtained by the thermal decomposition of monosilane SiH4 under an ambient temperature of up to 620° C. and preferably to a thickness of 800A. When an aluminum electrode (described later) is deposited having a thickness of approximately $1\mu$, the desirable thickness of this polysilicon layer 43 is in the range of 300 to 3000A. The polysilicon layer 43 is not required to have a particular impurity since the impurity from the region 37 in contact with the polysilicon will be doped thereinto. The polysilicon layer 43 may be formed by either evaporation or preferably chemical vapor deposition to obtain a high degree of uniformity in the film thickness.

Subsequently, a PSG layer 44 is formed over the polysilicon layer 43. The PSG layer 44 is preferably formed by the gaseous reaction between phosphin PH3, monosilane SiH4 and oxygen. The thickness is preferably within the range of 2000A to $1\mu$ without particular limitation.

Figure 7:
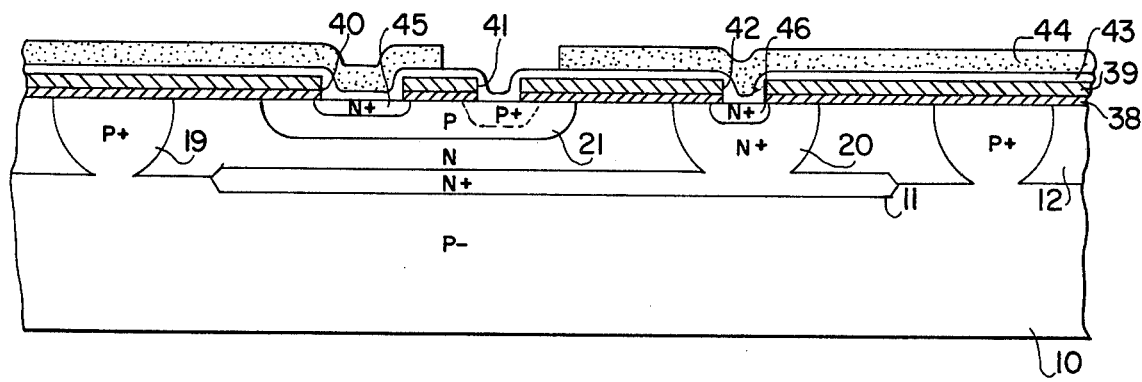

In FIG. 7, the areas of the PSG layer 44 on the base electrode window the resister electrode window and Schottky barrier diode formation area (not illustrated) are shown as removed by applying a photolithography process. It is important that the PSG layer 44 be left at least on the emitter electrode window 40 and collector electrode window 42.

Heat treatment is then carried out to achieve emitter diffusion. The emitter diffusion process is performed under a temperature of 1150° C. in an oxygen ambient condition, for a treatment period of 90 seconds. By this processing, an emitter region having a depth of $0.3\mu$, surface concentration of about $5 \times 10^{20}$ atom/cm$^3$, and a collector contact region 46 are formed.

Then, the remaining areas of PSG layer 44 are all removed by using an etching solution, such as a buffer solution consisting of hydrofluoric acid and acidic ammonium fluoride.

Figure 8:
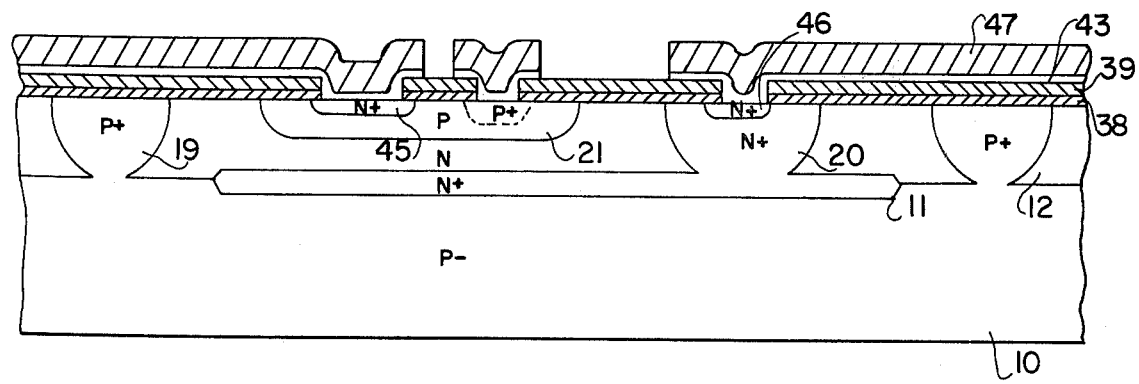

In FIG. 8, an aluminum electrode material 47 is shown evaporated with a thickness of $1\mu$. Then, the aluminum 47 and polysilicon layer 43 are selectively removed to define a conductor wiring area. Phosphoric acid with an additive of nitric acid is used for etching the aluminum, and a solution of hydrofluoric acid, nitric acid and phosphoric acid is used for etching the polysilicon. Since the selective etching of polysilicon uses the aluminum as a mask, plasma etching can also be used, such as with an activated gas of CF4 containing 5% oxygen.

It will be apparent that many modifications and variations may be effected without departing from the scope of the novel concept of this invention. Therefore, it is intended by the appended claims to cover all such modifications and variations which fall within the true spirit and scope of the invention.

We claim:

1. A method of manufacturing a semiconductor device on a substrate surface comprising the steps of:
   (a) forming a base region and an insulating layer on said semiconductor substrate surface, said insulating layer covering said semiconductor substrate surface;
   (b) forming an emitter electrode window and a base electrode window in said insulating layer to expose said semiconductor substrate surface in each window;
   (c) forming a polycrystal semiconductor layer over the entire area of said insulating layer including said windows;
   (d) masking the polycrystal layer in the base window;
   (e) forming an emitter region by introducing an impurity utilizing an ion beam into said substrate through said polycrystal semiconductor layer formed in said emitter electrode window;
   (f) diffusing a base impurity into said polycrystal semiconductor layer in said base electrode window from said base region so as to make said polycrystal semiconductor layer in said base electrode window conductive;
   (g) forming an electrode metal layer over the entire are of said polycrystal semiconductor layer; and
   (h) selectively removing said electrode metal layer and the corresponding underlying polycrystal semiconductor layer to form wiring electrodes with said polycrystal semiconductor layer remaining between said semiconductor substrate and said electrode metal layer at each of said emitter and base electrode windows thereby forming an emitter electrode and a base electrode which are ohmically connected to said emitter region and said base region respectively.

2. A method of claim 1, wherein said semiconductor substrate is silicon.

3. A method of claim 1, wherein said insulating layer is substantially composed of SiO$_2$.

4. A method of claim 1, wherein said polycrystal semiconductor layer is substantially composed of polysilicon.

5. A method of manufacturing a semiconductor device on a silicon substrate comprising the steps of:

forming a base region in said silicon substrate;

forming a silicon dioxide film over the entire surface of said silicon substrate;

forming an emitter diffusion window and base electrode window on said silicon dioxide film covering said silicon substrate surface to expose said silicon substrate surface base region in said windows;

forming a polysilicon layer over the entire surface of said silicon dioxide film and each of said formed windows;

forming a diffusion source layer including an impurity over the entire surface of said polycrystal silicon layer, except for at least the base electrode window;

forming an emitter region within the base region by diffusing said impurity into the silicon substrate at said emitter diffusion window through the polycrystal silicon layer;

simultaneously diffusing a base impurity into said polycrystal semiconductor layer in said base electrode window from said base region so as to make said polycrystal semiconductor layer in said base electrode window conductive;

removing said diffusion source layer;

coating an electrode metal layer over the entire surface of said polycrystal silicon layer;

selectively removing said electrode metal layer and the corresponding underlying polycrystal silicon layer to form wiring electrodes having said polycrystal silicon layer remaining between said silicon substrate and said electrode metal layer at each of said emitter and base electrode windows thereby forming an emitter electrode and a base electrode which are ohmically connected to said emitter region and said base region respectively.

6. A method of claim 5, wherein said diffusion source is phosphosilicate glass.

7. A method of claim 5, wherein said diffusion source is arsenic silicate glass.

8. A method of claim 5, wherein a collector electrode window is also formed in said silicon dioxide film during said step of forming said emitter and base windows.

9. A method of claim 5, wherein the surface concentration of the base region for forming the base electrode window is kept higher than that of the remainder of the base region.

10. A method of manufacturing semiconductor integrated circuits on a silicon substrate, comprising the steps of:

forming a base region in said silicon substrate;

diffusing an impurity into the base region, for providing a base electrode, by resistor diffusion;

removing entirely any insulating film covering the silicon substrate;

forming a silicon dioxide film on the silicon substrate surface;

forming an emitter diffusion window, a base electrode window, a collector electrode window and resistor electrode window in said formed silicon dioxide film to expose said silicon substrate surface in said windows;

forming a uniform polycrystal silicon layer in said electrode windows and on said silicon dioxide film;

forming an insulating film including impurities for emitter formation over the entire area of said polycrystal silicon layer;

removing said insulating film from at least the base electrode window and resistor electrode window;

simultaneously diffusing impurities in said insulating film into said silicon substrate through said polycrystal silicon layer in said emitter electrode window;

diffusing a base impurity into said polycrystal semiconductor layer in said base electrode window from said base region so as to make said polycrystal semiconductor layer in said base electrode window conductive;

removing said insulating film from said polycrystal silicon layer;

coating an aluminum electrode layer on said polycrystal silicon layer;

patterning and selectively removing of said aluminum electrode layer to form wiring electrodes;

removing by etching the exposed polycrystal silicon layer, using said remaining aluminum electrode layer as a mask to leave said polycrystal silicon layer between said silicon substrate and each of said electrodes corresponding to said pattern thereby forming an emitter electrode and a base electrode which are ohmically connected to said emitter region and said base region respectively.

* * * * *

UNITED STATES PATENT OFFICE
CERTIFICATE OF CORRECTION

Patent No. 4,125,426                Dated November 14, 1978

Inventor(s) Katsuyuki Inayoshi et al.

It is certified that error appears in the above-identified patent and that said Letters Patent are hereby corrected as shown below:

[30] "Apr. 29, 1975" should be -- Apr. 30, 1975 --.

Abstract, line 4, "silcon" should be -- silicon --.

Column 5, line 32, "implanatation" should be -- implantation --.

Column 7, line 35, "but" should be -- not --.

Column 7, line 58, after "window" first occurrence insert -- , --.

Column 8, line 49, "are" should be -- area --.

Signed and Sealed this

Tenth Day of April 1979

[SEAL]

Attest:

RUTH C. MASON
Attesting Officer

DONALD W. BANNER
Commissioner of Patents and Trademarks